United States Patent [19]
Visser-Bartelds et al.

[11] Patent Number: 5,888,584
[45] Date of Patent: Mar. 30, 1999

[54] PROVISION OF TRACKS ON FLAT SUBSTRATES BY MEANS OF A STENCIL-PRINTING METHOD

[75] Inventors: Jantje Visser-Bartelds; Pedro F. Henriëtte; Marcel J. Van Den Bogert; Gerard H. L. Teeuwen, all of Eindhoven, Netherlands

[73] Assignee: U.S. Philips Corporation, New York, N.Y.

[21] Appl. No.: 870,056

[22] Filed: Jun. 5, 1997

[30] Foreign Application Priority Data

Jun. 11, 1996 [EP] European Pat. Off. .............. 96201623
Jul. 1, 1996 [EP] European Pat. Off. .............. 96201824

[51] Int. Cl.$^6$ ................................. B05D 1/32; B05D 5/12
[52] U.S. Cl. ........................ 427/96; 427/282; 427/287; 101/129
[58] Field of Search ..................... 427/143, 282, 427/96, 287; 118/504; 101/127, 128.21, 129

[56] References Cited

U.S. PATENT DOCUMENTS

| | | | |
|---|---|---|---|
| 4,636,406 | 1/1987 | Leicht | 427/96 |
| 4,803,110 | 2/1989 | Ahn et al. | 428/137 |
| 4,953,460 | 9/1990 | Wojcik | 101/129 |
| 4,961,955 | 10/1990 | Goldberg | 427/560 |
| 5,046,415 | 9/1991 | Oates | 101/128.21 |
| 5,361,695 | 11/1994 | Takagi et al. | 101/127 |

FOREIGN PATENT DOCUMENTS 61113064A of 0000 Japan ................. G03F 7/12
WO9318440 9/1993 WIPO .

*Primary Examiner*—Shrive Beck
*Assistant Examiner*—Fred J. Parker
*Attorney, Agent, or Firm*—Robert J. Kraus

[57] ABSTRACT

The invention relates to a method of providing tracks, for example conductive tracks, in a flat display device (such as a plasma display or PALC display) by means of a stencil-printing method. In particular, paste is formed through multilayer stencils enabling the quantity of printing paste passed to be varied locally.

6 Claims, 2 Drawing Sheets

PROVISION OF TRACKS ON FLAT SUBSTRATES BY MEANS OF A STENCIL-PRINTING METHOD

BACKGROUND OF THE INVENTION

The invention relates to a method of providing tracks on a substrate in accordance with a pattern by means of a printing technique, for example, a resist pattern, conductor pattern, insulator pattern, resistor pattern or a black matrix. The invention can be used, in particular, to provide tracks of an electroconductive material on a substrate of an electrically insulating material (for example on glass or ceramic plates in a flat display device, such as a plasma display or PALC display (plasma-addressed liquid crystal display)).

In general, metal tracks are provided on insulating plates for a flat display device in the following manner: a layer of a metal is grown on the entire plate. Subsequently, the tracks are screen printed using a resist. Screen printing is carried out as follows: a screen-printing screen of a metal or synthetic gauze (for example polyester) embedded in a photopolymer, a part of the photopolymer layer being removed in accordance with the desired pattern, is placed on the substrate (the surface to be printed). In a screen-printing operation a squeegee is passed over the screen-printing screen, thereby the paste (for example a resist) used for printing is spread. With the squeegee a pressure is exerted on the screen-printing screen so that said screen engages the substrate and the hydrodynamic pressure causes a specific quantity of paste to enter the apertures in the screen-printing screen. When the squeegee recedes, the screen printing screen comes away from the substrate and the paste is transferred from the screen-printing screen to the substrate. After the resist has been screen printed, it is cured (depending on the type, with heat, radiation or light). The metal which is not covered with resist is removed by etching, whereafter the resist is removed.

The conductive tracks on the insulating plates in a flat display device are very narrow and, depending on the type of display devices, extend along the wall of cavities or holes in the plates. To ensure that the tracks extending in said cavities or holes are properly formed, two printing steps must be carried out during the provision of the resist. In a first printing step, the resist is provided to form the flat sections of the tracks, and in a second printing step, the resist is provided to form the sections of the tracks extending along the walls of cavities or holes. A problem may also arise if the width of the tracks is of the same order of magnitude as the meshes of the gauze in the screen-printing screen. This will lead to deformation of the tracks.

OBJECTS AND SUMMARY OF THE INVENTION

It is an object of the invention to provide a rapid, practical printing technique having an improved resolution and accuracy. To this end, the method in accordance with the invention is characterized in that a stencil of a solid material having holes in accordance with the pattern to be provided on the substrate is used for printing. Apart from the holes, stencils are solid structures, so that they are much more stable than a screen-printing screen. Since the invention employs stencils having holes in the form of the pattern to be printed instead of a gauze having meshes, lines which are less subject to deformation can be provided. In a preferred embodiment, the quantity of printing paste is controlled by providing the upper side of the stencil with recesses at some locations, so that the depth of the holes is reduced at said locations. The squeegee then penetrates into the recesses. The invention preferably employs multilayer stencils. The pattern to be printed is formed in the bottom layer (at the side facing the substrate during printing). Capillaries are situated above the pattern to be printed. The flow resistance of the capillaries is a function of the diameter, length and shape thereof. The quantity of paste passing through the capillaries during a printing step can be controlled much more accurately than in the case of a monolayer stencil. By varying the shape and size of capillaries, at some locations more resist can be pressed through the screen than at others during the same printing step. A three-layer stencil comprising reservoirs above the capillaries enables dosing to be further improved. Said reservoirs are so small that they cannot be penetrated by the squeegee. Paste is left in the reservoirs. Depending on the shape and length of the capillaries and on the viscosity of the paste, said paste remains in the capillaries or adheres to the paste in the reservoirs or becomes detached here from and is removed from the stencil. The above-described dosing methods enable tracks extending in holes or cavities in a substrate to be printed in a single operation. By properly varying the size and shape of the capillaries and by the presence or absence of reservoirs above the capillaries, a larger quantity of paste is supplied to the holes or cavities in the substrate than to the rest of the tracks during a printing step. In this manner, it is also possible to print, for example, conductive tracks having a variable thickness. At the location in the track where a resistance element is to be provided, the track itself can be printed in a smaller thickness, hence forming a resistance element. As the multilayer stencil is thicker, it is also more stable. This has a favorable effect on the accuracy of the printing process. The bottom layer of the stencil may be made of a flexible material, which results in better sealing properties. As a result, the degree of running is reduced, which also has a positive effect on the accuracy. The stencil-printing process is carried out in the same manner as the above-described screen printing process, with this difference that a stencil is used instead of a screen-printing screen.

These and other aspects of the invention will be apparent from and elucidated with reference to the embodiments described hereinafter.

DESCRIPTION OF THE PREFERRED EMBODIMENTS

Figure 1:
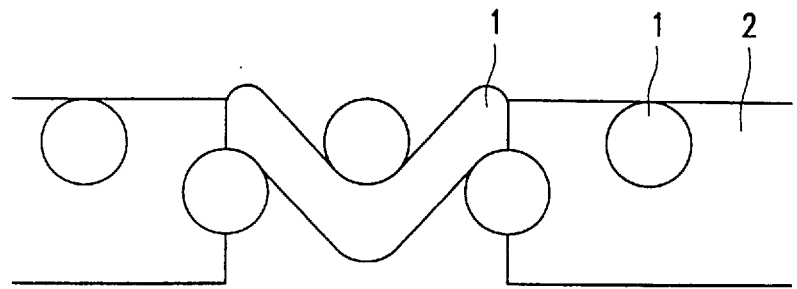
FIG. 1 is a schematic cross-sectional view of a part of a screen-printing screen from which the photopolymer layer has been partly removed.

FIG. 1 is a schematic cross-sectional view of a part of a screen-printing screen in which the wires of the woven screen and the photopolymer are referenced (1) and (2), respectively.

Figure 2A:
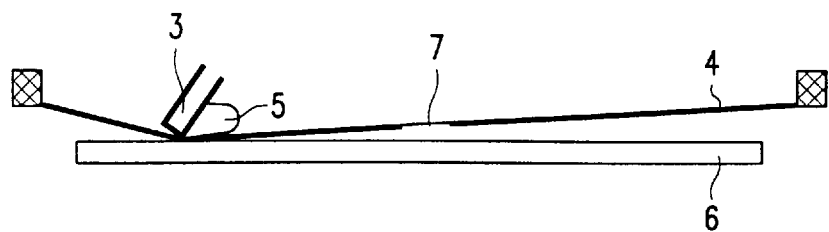
FIG. 2A and FIG. 2B schematically show the screen printing process in which the squeegee is passed over the screen to spread the paste, so that after removal of the squeegee paste remains on the substrate at the location of the apertures in the screen.
Figure 2B:
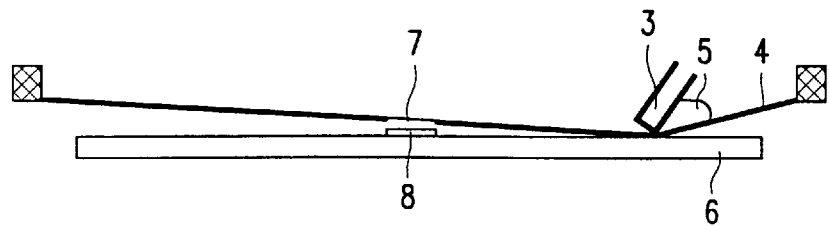

FIG. 2A shows the position of the squeegee (3) on the screen (4). Said squeegee (3) spreads the paste (5), thereby exerting a pressure on the screen (4) so that said screen engages the substrate (6). An aperture in the screen (4) is indicated by reference numeral (7). FIG. 2B shows that after the paste-spreading squeegee (3) has passed over the aperture (7), a quantity of paste (8) is applied to the substrate (6) at the location of said aperture. The above is known from the prior art.

Figure 3A:
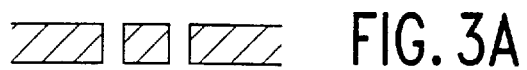
FIG. 3A is a schematic cross-sectional view of a stencil.
Figure 3B:
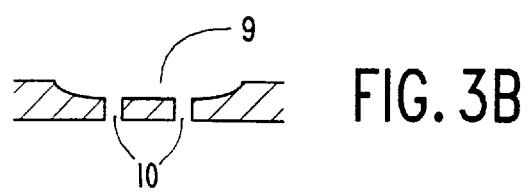
FIG. 3B is a schematic cross-sectional view of a stencil which is locally provided, on the side of the stencil facing away from the substrate during the printing process, with a reservoir above the holes.

Next, the invention will be explained by means of the following Figures. FIGS. 3A and 3B are schematic views of stencils. The stencil shown in FIG. 3B is locally provided with a recess (9) above the holes (10), so that less paste is provided at said location during the printing process. These stencils have the advantage that, unlike the screen-printing screen, problems regarding resolution are precluded. Gauze, which limits the resolution, is absent.

Figure 4A:
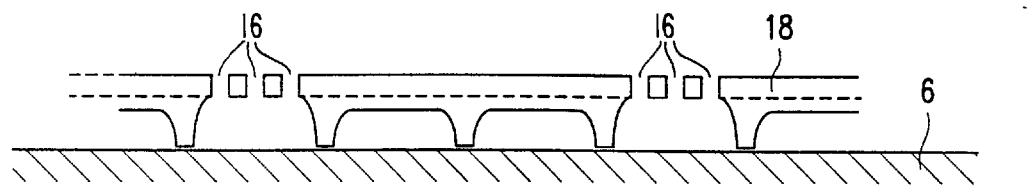
FIG. 4A is a schematic cross-sectional view of a part of a stencil with two layers.
Figure 4B:
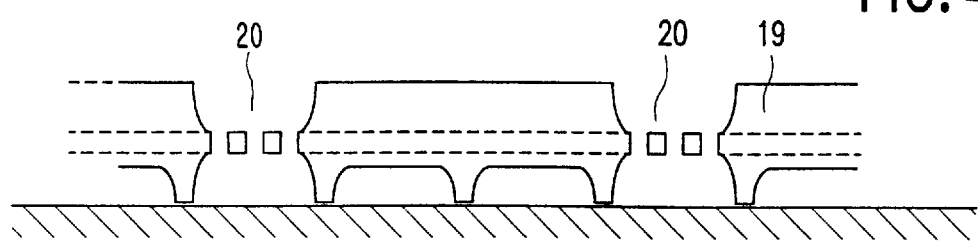
FIG. 4B is a schematic cross-sectional view of a stencil with three layers.

FIG. 4A is a schematic, cross-sectional view of a stencil 18 with two layers. FIG. 4B is a schematic cross-sectional view of a stencil 19 with additional reservoirs 20 above the capillaries 16 (a stencil with three layers). There are various embodiments of the multilayer stencils, for example:

first, a stencil having two layers which is entirely made of a metal, second, a stencil having three layers which is entirely made of a metal, third, a stencil having three layers of which the side facing the substrate during the printing process is made of a flexible material.

Advantages of the second embodiment are:

relatively thick screens enable thinner layers to be printed, which screens lead to less pattern deformation than thin screens.

by virtue of the presence of the reservoirs, the squeegee cannot penetrate into the capillaries, so that the printing thickness cannot be influenced.

the quantity of paste removed from the screen can be more accurately controlled.

In addition to the advantage of the second embodiment, the advantage of the third embodiment is that by using a flexible layer the risk of running is reduced. The side of an ordinary stencil facing the substrate during the printing process can also be provided with a flexible layer.

Figure 4C:
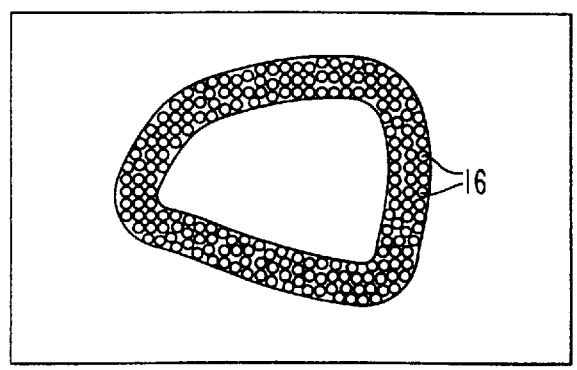
FIG. 4C is a schematic plan view of a stencil whose pattern is in accordance with a closed form.

All multilayer stencils have the following additional advantages:

stencils used for printing tracks whose length is relatively large relative to the width do not become instable, even if a plurality of said long narrow tracks are printed next to each other. The material surrounding the capillaries ensures the stability of the stencil.

also closed forms such as is illustrated in FIG. 4C, can be printed easily. The material surrounding the capillaries ensures that the inner part of the closed form remains adhered to the stencil material outside the closed form.

Thin lines printed in accordance with the invention are much less subject to deformation than the lines printed by means of the screen-printing process. It is also possible to utilize variable paste transfer, i.e. the locally desired quantity of paste can be provided. This is important, for example, when layers are applied to surfaces having recesses or holes. Finally, running can be precluded.

In summary, the invention relates to providing fine tracks, for example conductive tracks, in a flat display device (such as plasma display or PALC display) by means of a stencil printing method. In particular, use can be made of multilayer stencils enabling the quantity of printing paste passed to be varied locally.

We claim:

1. A method of printing a paste material on a substrate in a pattern defining a conductive layer, said method comprising:

a. attaching a stencil to the substrate, said stencil comprising:

i. a first layer in contact with the substrate, said first layer having at least one opening proximate the substrate and in the form of said pattern;

ii. a second layer having at least one group of capillaries in communication with the at least one opening for controlling the flow of the paste to said at least one opening;

iii. a third layer having at least one reservoir in communication with the at least one group of capillaries for cooperatively controlling dosing of the paste to be applied locally to the substrate;

b. forcing the paste into the at least one reservoir, the at least one group of capillaries, and the at least one opening to apply a predetermined thickness of the paste to the substrate in said pattern.

2. A method as in claim 1 where the stencil consists essentially of a metallic material.

3. A method as in claim 1 where the first layer consists essentially of a flexible material and the third layer consists essentially of a metallic material.

4. A method as in claim 1 where the first layer consists essentially of a flexible material.

5. A method as in claim 1 where the paste comprises a resist.

6. A method as in claim 1 where the paste comprises an electroconductive material and the substrate comprises an electrically insulating material.

* * * * *